US009280069B2

(12) United States Patent
Kawamura

(10) Patent No.: US 9,280,069 B2
(45) Date of Patent: Mar. 8, 2016

(54) EXPOSURE APPARATUS, PRODUCING METHOD OF EXPOSURE APPARATUS, AND PRODUCING METHOD OF MICRODEVICE

(75) Inventor: Shuji Kawamura, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 180 days.

(21) Appl. No.: 11/661,296

(22) PCT Filed: Mar. 28, 2006

(86) PCT No.: PCT/JP2006/306232
§ 371 (c)(1),
(2), (4) Date: Apr. 17, 2007

(87) PCT Pub. No.: WO2006/104127
PCT Pub. Date: Oct. 5, 2006

(65) Prior Publication Data
US 2008/0030702 A1  Feb. 7, 2008

(30) Foreign Application Priority Data
Mar. 29, 2005  (JP) .................... 2005-095225

(51) Int. Cl.
G03B 27/44 (2006.01)
G03B 27/58 (2006.01)
G03B 27/62 (2006.01)
G03F 7/20 (2006.01)

(52) U.S. Cl.
CPC ........ *G03F 7/70833* (2013.01); *G03F 7/70791* (2013.01); *G03F 7/70975* (2013.01)

(58) Field of Classification Search
CPC ............ G03F 7/70791; G03F 7/70833; G03F 7/70825; G03F 7/70716; G03F 7/70725; G03F 7/70275; G03F 7/70975

USPC ........... 355/53, 46, 52, 77, 67–75; 250/492.1, 250/492.2, 492.22, 548; 430/5, 8, 22, 30, 430/311, 312, 321, 322
See application file for complete search history.

(56) References Cited

U.S. PATENT DOCUMENTS

| 4,803,712 A | * | 2/1989 | Kembo et al. ................... 378/34 |
| 5,528,118 A | * | 6/1996 | Lee ............................ 318/568.17 |
| 5,614,988 A | | 3/1997 | Kato et al. |
| 5,691,806 A | * | 11/1997 | Tokuda et al. .................. 355/72 |
| 5,781,277 A | * | 7/1998 | Iwamoto ........................ 355/53 |

(Continued)

FOREIGN PATENT DOCUMENTS

| EP | 1 237 044 A2 | 9/2002 |
| JP | A-11-16820 | 1/1999 |

(Continued)

OTHER PUBLICATIONS

Jan. 28, 2010 Search Report issued in PCT/JP2006306232.

(Continued)

*Primary Examiner* — Christina Riddle
(74) *Attorney, Agent, or Firm* — Oliff PLC

(57) ABSTRACT

An exposure apparatus for exposing a pattern formed on a mask (M) onto a photosensitive substrate (P) through a projection optical system (PL), comprising an upper pedestal (26) on which at least one of the projection optical system (PL) and a mask stage (MST) which is to hold the mask (M) is mounted, and a plurality of lower pedestals (6a) which supports the upper pedestal (26) and which has a longitudinal direction in a predetermined direction.

38 Claims, 8 Drawing Sheets

(56) References Cited

U.S. PATENT DOCUMENTS

| | | | |
|---|---|---|---|
| 5,909,272 A * | 6/1999 | Osanai et al. | 355/53 |
| 5,973,766 A * | 10/1999 | Matsuura et al. | 355/52 |
| 5,973,863 A * | 10/1999 | Hatasawa et al. | 359/823 |
| 5,986,743 A * | 11/1999 | Hanzawa | 355/53 |
| 6,036,162 A * | 3/2000 | Hayashi | 248/550 |
| 6,195,153 B1 * | 2/2001 | Shimizu | 355/53 |
| 6,327,026 B1 * | 12/2001 | Wakui | 355/72 |
| 6,342,942 B1 * | 1/2002 | Uzawa | 355/53 |
| 6,490,025 B1 * | 12/2002 | Makinouchi et al. | 355/53 |
| 6,606,146 B2 * | 8/2003 | Saiki | 355/72 |
| 6,774,981 B1 * | 8/2004 | Watson et al. | 355/53 |
| 6,870,600 B2 * | 3/2005 | Hazelton | 355/53 |
| 2002/0018192 A1 * | 2/2002 | Nishi | 355/53 |
| 2002/0085190 A1 * | 7/2002 | Nishi | 355/53 |
| 2002/0163631 A1 * | 11/2002 | Sogard | 355/74 |
| 2003/0030779 A1 * | 2/2003 | Hara | 355/53 |
| 2004/0008332 A1 * | 1/2004 | Nakaya | G03F 7/70275 355/53 |
| 2004/0100624 A1 * | 5/2004 | Hagiwara et al. | 355/72 |
| 2005/0002009 A1 * | 1/2005 | Lee | 355/72 |
| 2005/0083500 A1 * | 4/2005 | Franken | 355/53 |
| 2005/0248744 A1 * | 11/2005 | Shibazaki | 355/72 |
| 2006/0077368 A1 * | 4/2006 | Iwata et al. | 355/53 |

FOREIGN PATENT DOCUMENTS

| | | |
|---|---|---|
| JP | A 11-295901 | 10/1999 |
| JP | A 2004-111569 | 4/2004 |
| JP | A 2004-177468 | 6/2004 |
| WO | WO 2004/107416 A1 | 12/2004 |

OTHER PUBLICATIONS

Office Action issued in European Patent Application No. 06730180.4; Jun. 18, 2010.

Written Opinion issued in International Patent Application No. PCT/JP2006/306232; mailed Jul. 4, 2006; with English-language translation.

International Search Report issued in International Patent Application No. PCT/JP2006/306232; Jul. 4, 2006; with English-language translation.

Oct. 4, 2011 Office Action issued in Japanese Patent Application No. 2007-510514 (with translation).

Jul. 13, 2012 Office Action issued in Korean Patent Application No. 2007-7004140 w/translation.

Feb. 4, 2013 Office Action issued in Korean Patent Application No. 2007-7004140 (with translation).

Nov. 13, 2012 Taiwanese Office Action issued in Taiwanese Patent Application No. 095110663 (with translation).

* cited by examiner

EXPOSURE APPARATUS, PRODUCING METHOD OF EXPOSURE APPARATUS, AND PRODUCING METHOD OF MICRODEVICE

TECHNICAL FIELD

The present invention relates to an exposure apparatus for producing a microdevice such as a flat panel display element like a liquid crystal display element using a lithography step, and to a producing method of the exposure apparatus, and a producing method of a microdevice using the exposure apparatus.

BACKGROUND TECHNIQUE

At present, for producing of a liquid crystal display element device and the like, there is used a photolithography technique for transferring a fine pattern formed on a mask onto a photosensitive substrate. In the producing step using the photolithography technique, a mask is placed on a mask stage which moves two dimensionally, and a projection exposure apparatus is used in this photolithography technique. The projection exposure apparatus projects and exposes a pattern formed on the mask onto a photosensitive substrate to which sensitizer is applied. The sensitizer is placed on a substrate stage which two dimensionally moves through a projection optical system. The photosensitive substrate is a substrate in which sensitizer is applied to a surface of a glass plate or the like. As shown in FIG. 7, a conventional exposure apparatus is assembled by placing a pedestal (column) 106 on which a mask stage 104 and a projection optical system (not shown) are placed is placed on a pedestal (surface plate) 102 on which a substrate stage 100 is placed.

DISCLOSURE OF THE INVENTION

In recent years, in the exposure apparatus, as a substrate for a flat panel display element, e.g., for a liquid crystal display is increased in size, a mask and a substrate (also mask stage and substrate stage) are also increased in size, and strokes of the mask stage and substrate stage are also elongated. Therefore, the pedestals which hold the mask stage and the substrate stage are also increased in size. However, the size of the exposure apparatus having such pedestals is limited due to width of roads when the exposure apparatus is transported.

It is an object of the present invention to provide an exposure apparatus having a plurality of pedestals on which at least a portion of an exposure body (e.g., at least one of a mask stage and a projection optical system) and a substrate stage and the like, a producing method of the exposure apparatus, and a producing method of a microdevice using the exposure apparatus.

According to a first aspect of the present invention, there is provided an exposure apparatus for exposing a pattern formed on a mask onto a photosensitive substrate through a projection optical system, comprising an upper pedestal on which at least one of the projection optical system and a mask stage which is to hold the mask is mounted, and a plurality of lower pedestals which are separatable from the upper pedestal and which has a longitudinal direction in a predetermined direction.

According to the first aspect of the invention, the exposure apparatus includes the plurality of lower pedestals which can separate from the upper pedestal and which have longitudinal direction in the predetermined direction. Therefore, the lower pedestals can be loaded on a vehicle (any by extension, aircraft) and transported, and the exposure apparatus having a large substrate stage on which a large substrate can be placed can be provided.

According to a second aspect of the invention, there is provided an exposure apparatus for exposing a pattern onto a photosensitive substrate through a projection optical system, comprising a first pedestal (upper pedestal) provided with at least a portion of an exposure body which includes the projection optical system, and a second pedestal which is separatable from the first pedestal which supports the first pedestal by a pair of support portions (intermediate pedestals) each extending in a first direction as a longitudinal direction, the pair of supports being disposed separately in a second direction intersecting with the first direction with the projection optical system interposed therebetween.

According to the second aspect, the exposure apparatus includes the first pedestal provided with at least the portion of the exposure body, and the second pedestal which can separate from the first pedestal, which extends in a first direction as the longitudinal direction, and which supports the first pedestal by the pair of support portions disposed such as to separate in the second direction intersecting with the first direction with the projection optical system interposed therebetween. Therefore, if the pedestals are separated, they can be loaded on a vehicle (any by extension, aircraft) and transported.

According to a third aspect of the invention, there is provided a producing method of an exposure apparatus for exposing a pattern onto a photosensitive substrate through a projection optical system, comprising a lower pedestal disposing step for disposing a lower pedestal on which a substrate stage which is to hold the photosensitive substrate is mounted, an intermediate pedestal disposing step for disposing a plurality of intermediate pedestals on the lower pedestal disposed in the lower pedestal disposing step, and an upper pedestal disposing step for disposing an upper pedestal on the plurality of intermediate pedestals disposed in the intermediate pedestal disposing step, the upper pedestal on which at least a portion of an exposure body including the projection optical system is mounted.

According to the third aspect of the invention, the plurality of intermediate pedestals are disposed on the lower pedestal on which the substrate stage is mounted, and the upper pedestal on which at least a portion of the exposure body including the projection optical system is disposed on the plurality of intermediate pedestals. Therefore, it is possible to produce an exposure apparatus capable of exposing onto a large photosensitive substrate using the plurality of pedestals having such size that the pedestals can be transported.

According to a fourth aspect of the invention, there is provided a producing method of a microdevice, comprising an exposing step for exposing a predetermined pattern onto a photosensitive substrate using the exposure apparatus of the above aspects or an exposure apparatus, and a developing step for developing the photosensitive substrate exposed in the exposing step.

According to the fourth aspect of the invention, the microdevice is produced using the exposure apparatus of the above aspects or an exposure apparatus produced by the producing method of an exposure apparatus. Therefore, it is possible to expose a pattern of a mask precisely onto a large photosensitive substrate, and an excellent microdevice can be obtained.

The invention is effective for an apparatus and a method for exposing onto a large photosensitive substrate, e.g., a photosensitive substrate having an outer diameter exceeding 500 mm. Here, the outer diameter of the photosensitive substrate means one side or a diagonal line of the photosensitive substrate.

According to the exposure apparatus of the invention, the plurality of pedestals can be separated and loaded on a vehicle and transported. With this, it is possible to provide an exposure apparatus having a large substrate stage on which a large substrate can be placed.

According to the producing method of the exposure apparatus of the invention, the plurality of intermediate pedestals are disposed on the lower pedestal on which the substrate stage is mounted, and the upper pedestal on which at least a portion of the exposure body including the projection optical system is disposed on the plurality of intermediate pedestals. Therefore, it is possible to produce an exposure apparatus capable of exposing onto a large photosensitive substrate using the plurality of pedestals having such size that the pedestals can be transported.

According to the producing method of the microdevice of the invention, the microdevice is produced using the exposure apparatus of the invention or an exposure apparatus produced using the producing method of the invention. Therefore, it is possible to precisely expose a mask onto a large photosensitive substrate, and an excellent microdevice can be obtained.

DETAILED DESCRIPTION OF PREFERRED EMBODIMENT

Figure 1:
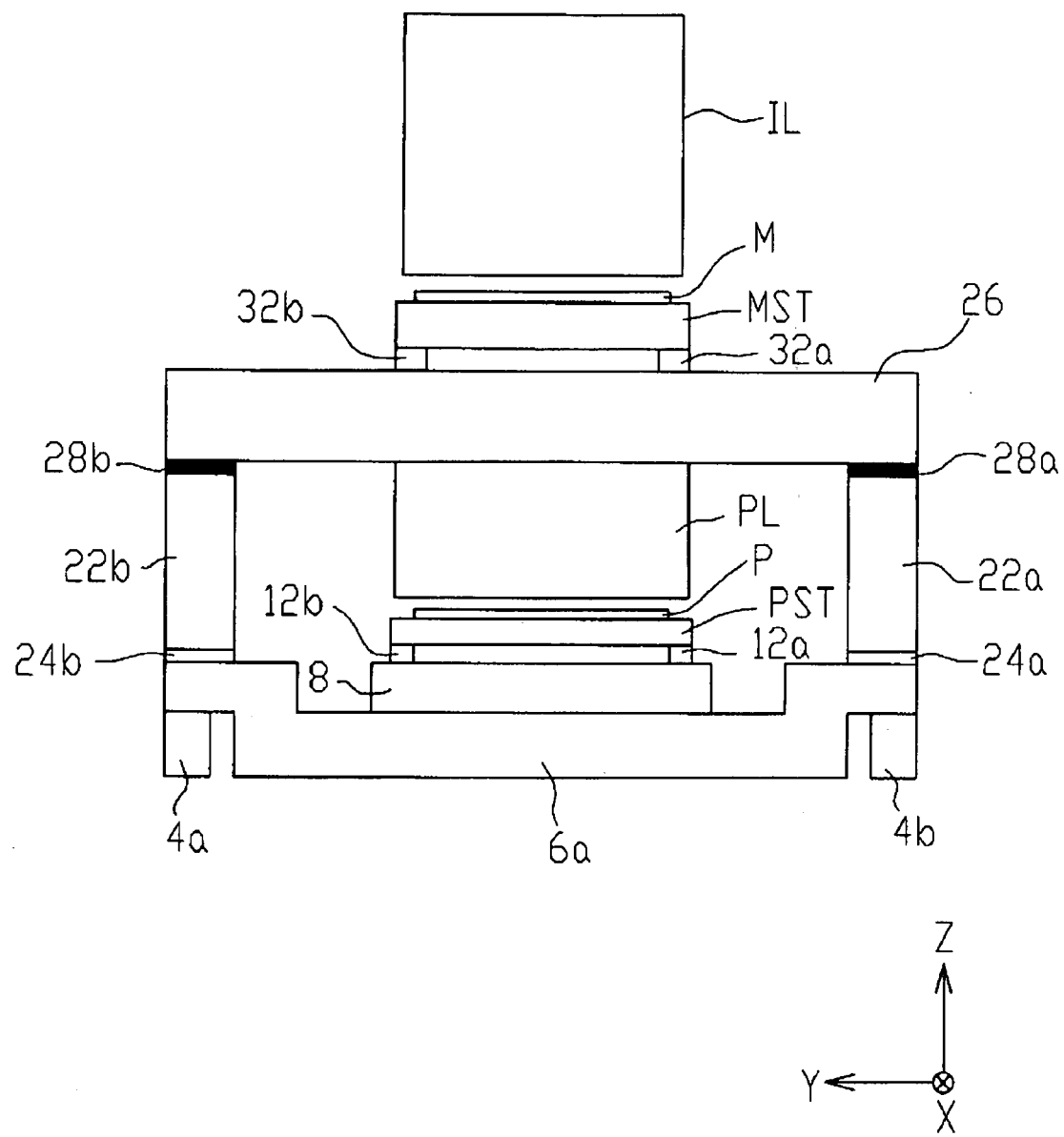
FIG. 1 is a schematic diagram showing a structure of an exposure apparatus according to an embodiment of the present invention.

An exposure apparatus according to an embodiment of the present invention will be explained with reference to the drawings. FIG. 1 is a schematic diagram showing a structure of the exposure apparatus of the embodiment. In the following description, an XYZ rectangular coordinate system shown in FIG. 1 is set, and a positional relationship of various members will be explained with reference to the XYZ rectangular coordinate system. In the XYZ rectangular coordinate system, an X-axis and a Y-axis are in parallel to a plate P, and a Z-axis is perpendicular to the plate P. The XYZ coordinate system in the drawing, an X-Y plane is in parallel to a horizontal plane, and the Z-axis is oriented in the vertical direction. In this embodiment, a direction (scanning direction) in which the plate P (plate stage PST) is moved is in the X-axis direction.

Figure 8:
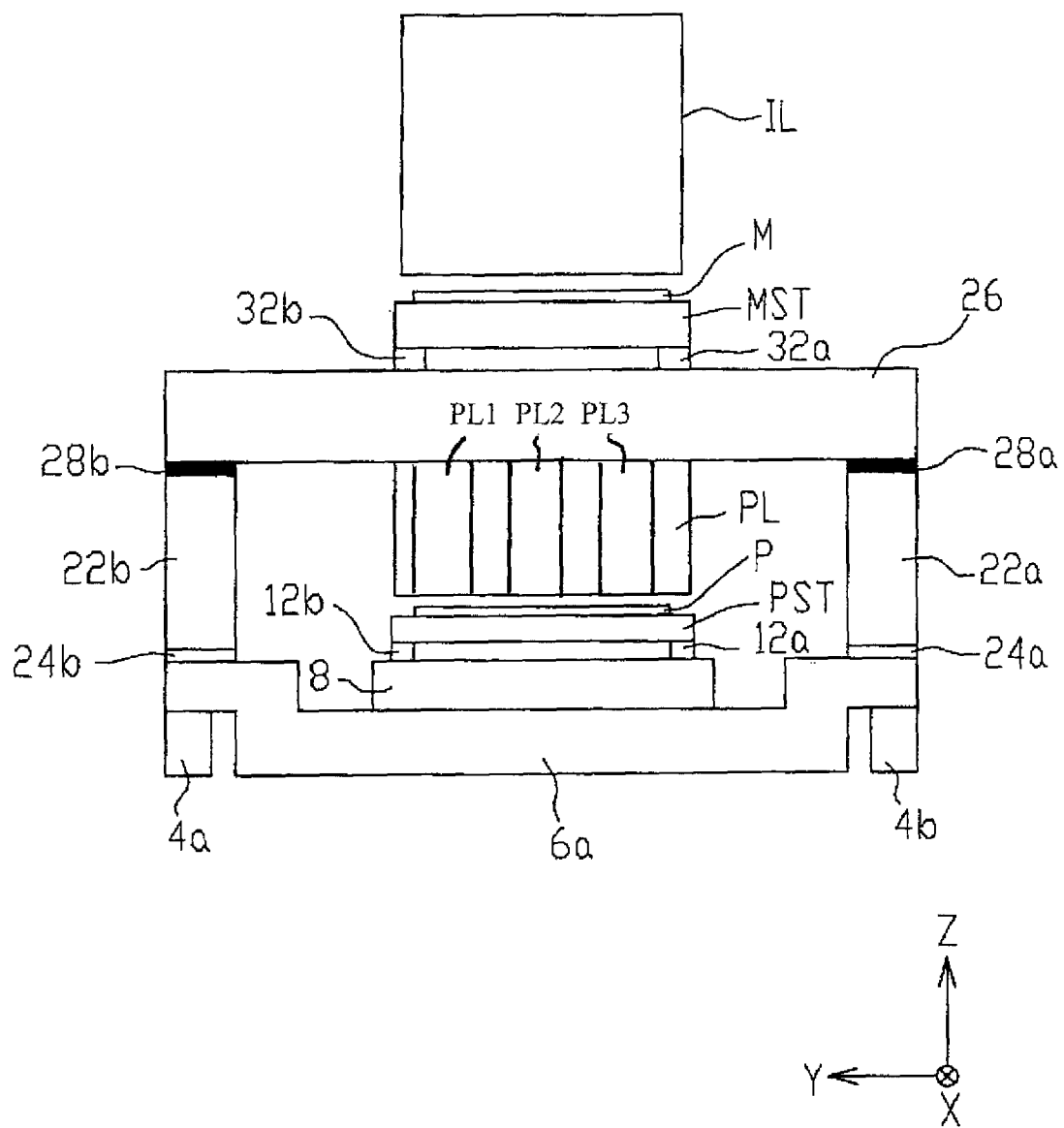
FIG. 8 is a schematic diagram showing a structure of an exposure apparatus according to an embodiment of the present invention having a plurality of projection optical modules.

As shown in FIG. 1, the exposure apparatus includes an illumination optical system IL having a light source and an illumination optical system. The illumination optical system IL radiates luminous flux and allows illumination of a mask M formed with a predetermined pattern in a superposing manner. The luminous flux which passes through the pattern of the mask M forms a pattern image of the mask M on the plate P which is a photosensitive substrate having an outer diameter exceeding 500 mm through the projection optical system PL. Here, the outer diameter exceeding 500 mm means that one side or a diagonal line exceeds 500 mm. The mask M is placed on a mask stage MST in the X-Y plane. A plate P is placed on the plate stage (substrate stage) PST. The exposure apparatus moves the mask stage MST and the plate stage PST in synchronization with each other, and two dimensionally drives and controls the plate stage PST and in this state, the exposure apparatus carries out scanning exposure. With this, patterns of respective masks M are exposed on a plurality of exposure regions of the plate P. A plurality of flat panel display devices are formed on the plate P. In this embodiment, the illumination optical system IL, the mask stage MST and the projection optical system PL constitute an exposure body, but when an electronic mask (which is also called a variable shaping mask, and includes a DMD (Digital Micro-mirror Device) which is one kind of non-luminous image display elements (spatial light modulators) is used, the mask stage MST is unnecessary. As shown in FIG. 8, the projection optical system PL may include a plurality of projection optical modules PL1, PL2, PL3, in which projection regions of pattern images are set in different positions at least in the Y-axis direction.

Figure 2:
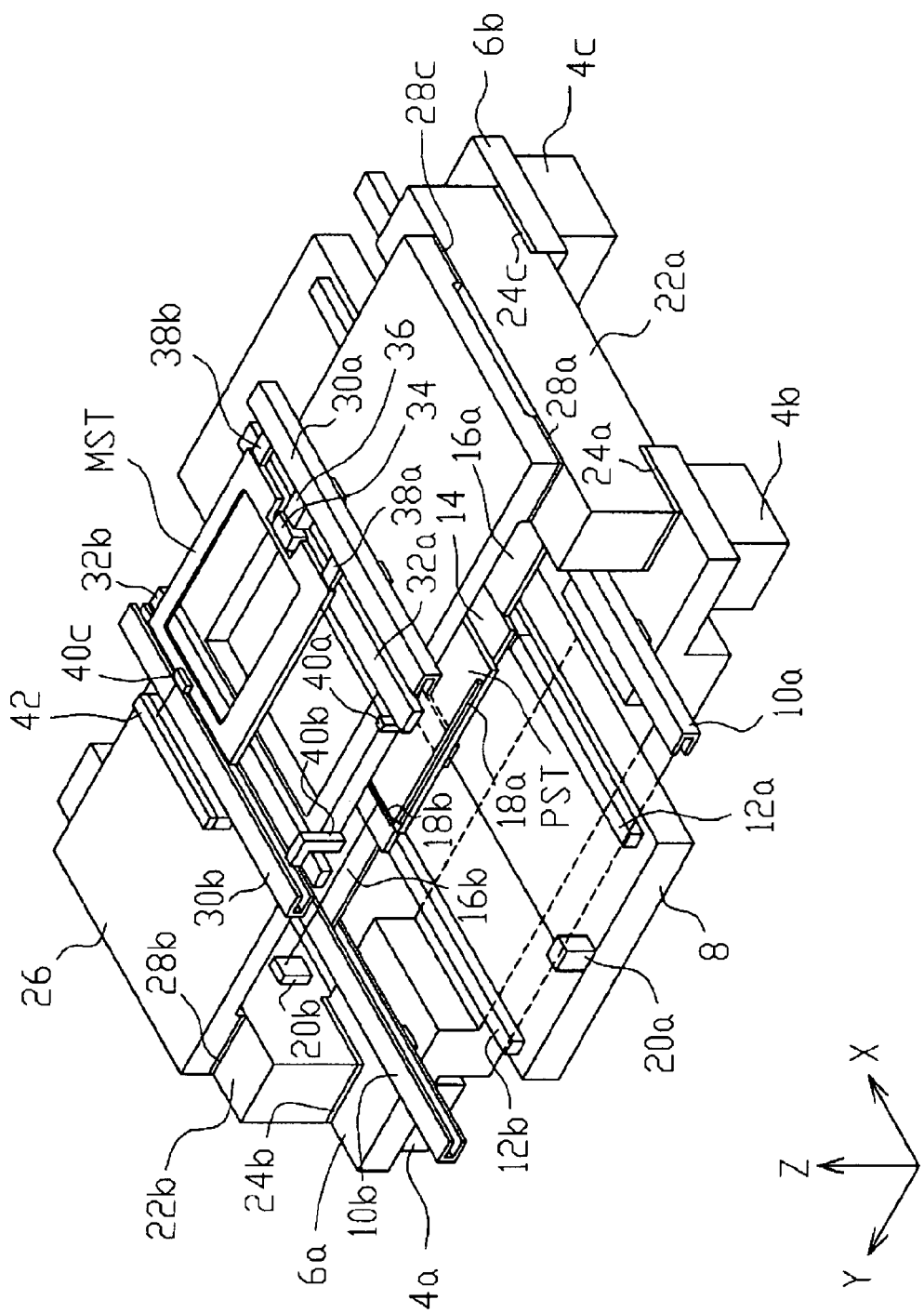
FIG. 2 is a perspective view showing structures from a mask stage to a plate stage of the embodiment of the invention.

As shown in FIG. 1, the exposure apparatus includes four vibration isolation systems (support members) 4a, 4b and 4c (see FIG. 2) on a base on which an exposure apparatus body is placed, and a vibration isolation system (vibration isolation system 4d, hereinafter) (not shown). FIG. 2 is a perspective view showing structures from the mask stage MST to the plate stage PST of the embodiment. In FIG. 2, the projection optical system PL is omitted.

As shown in FIGS. 1 and 2, the vibration isolation systems 4a and 4b are disposed on both ends of a lower pedestal 6a in its longitudinal direction. The lower pedestal 6a is disposed on the vibration isolation systems 4a and 4b. As shown in FIG. 2, the vibration isolation systems 4c and 4d are disposed on both ends of the lower pedestal 6b in its longitudinal direction. The lower pedestal 6b is disposed on the vibration isolation systems 4c and 4d. The vibration isolation systems 4a to 4d can adjust torsion of later-described air guides 12a and 12b after the exposure apparatus is assembled. The lower pedestal 6a supported by the vibration isolation systems 4a and 4b is disposed such as to have a longitudinal direction of the lower pedestal 6a on the side of the −X direction and in a direction intersecting with a scanning direction of the plate stage PST (a predetermined direction, Y-axis direction in this embodiment). The lower pedestal 6b supported by the vibration isolation systems 4c and 4d is disposed such as to have a longitudinal direction of the lower pedestal 6b on the side of the +X direction and in a direction intersecting with the scanning direction of the plate stage PST (a predetermined direction). The lower pedestals 6a and 6b are separated in a direction intersecting with the longitudinal direction. In this embodiment, the lower pedestals 6a and 6b comprise two structure materials. The lower pedestals 6a and 6b support an upper pedestal 26 through later-described intermediate pedestals 22a and 22b.

As shown in FIG. 2, a surface plate 8 (and by extension, the plate stage PST) are mounted on the lower pedestals 6a and 6b. A linear motor stator 10a having a longitudinal direction on the side of the −Y direction and in the X direction is disposed on the lower pedestals 6a and 6b. A linear motor stator 10b having a longitudinal direction on the side of the +Y direction and in the X direction is disposed on the lower pedestals 6a and 6b.

The surface plate 8 is disposed on the lower pedestals 6a and 6b. An air guide 14 which is a guide in a direction (non-scanning direction) intersecting with the scanning direction of the plate stage PST is disposed on the surface plate 8 between the linear motor stators 10a and 10b through the air guides 12a and 12b which are guides of the plate stage PST in the scanning direction. A linear motor 16a which is an actuator of the plate stage PST in the scanning direction is connected to the air guide 14 on the side of the linear motor stator 10a. A linear motor 16b which is an actuator of the plate stage PST in the scanning direction is connected to the air guide 14 on the side of the linear motor stator 10b. Therefore, if the linear motors 16a and 16b are driven, the air guide 14 (and by extension, the plate stage PST) moves along the scanning direction.

The plate stage PST is placed on the air guide 14. The plate P (not shown in FIG. 2) is adsorbed and held on the air guide 14 through a plate holder (not shown) on the plate stage PST. On the plate stage PST, a moving mirror 18a is provided on the −X direction and a moving mirror 18b is provided on the side of the linear motor stator 10b. A plate stage laser interferometer 20a is provided on the side of the −X direction on the surface plate 8, and a plate stage laser interferometer 20b is provided on a side surface of a later-described intermediate pedestal 22b on the side of the −Y direction. The plate stage laser interferometers 20a and 20b radiate laser beam onto the moving mirrors 18a and 18b and the laser beam is reflected by the moving mirrors 18a and 18b.

The plate stage interferometer 20a measures and control a position of the plate stage PST in the X-axis direction based on interference of laser beam reflected by the moving mirror 18a. The plate stage interferometer 20b measures and control a position of the plate stage PST in the Y-axis direction based on interference of laser beam reflected by the moving mirror 18b.

The intermediate pedestal 22a is disposed on the lower pedestals 6a and 6b on the side of the −Y direction, and the intermediate pedestal 22b is disposed on the lower pedestals 6a and 6b on the side of the +Y direction. The intermediate pedestals 22a and 22b are connected to the lower pedestals 6a and 6b, and the intermediate pedestals 22a and 22b connects the lower pedestals 6a and 6b and the upper pedestal 26 with each other. The intermediate pedestals 22a and 22b are disposed such as to have longitudinal directions of the intermediate pedestals 22a and 22b in a direction intersecting with the longitudinal directions of the lower pedestals 6a and 6b (X-axis direction, direction intersecting with a predetermined direction). That is, the intermediate pedestal 22a is disposed such that the longitudinal direction of the intermediate pedestal 22a on the side of the −Y direction is in parallel to the scanning direction of the plate stage PST. The intermediate pedestal 22b is disposed such that the longitudinal direction of the intermediate pedestal 22b on the side of the +Y direction is in parallel to the scanning direction of the plate stage PST. In this manner, the intermediate pedestals 22a and 22b are connected to the lower pedestals 6a and 6b in the form of #, and a space surrounded by the intermediate pedestals 22a and 22b is formed above the lower pedestals 6a and 6b.

The connection between the lower pedestal 6a and the intermediate pedestal 22a is provided with a correction spacer (position-adjusting correcting member) 24a. The correction spacer 24a has a function for moderating the machining precision of the lower pedestal 6a and the intermediate pedestal 22a. The size of the correction spacer (position-adjusting correcting member) 24a is determined based on size data when the lower pedestal 6a and the intermediate pedestal 22a are shaped. Similarly, the connection between the lower pedestal 6a and the intermediate pedestal 22b is provided with a correction spacer (position-adjusting correcting member) 24b, the connection between the lower pedestal 6b and the intermediate pedestal 22a is provided with a correction spacer (position-adjusting correcting member) 24c, and the connection between the lower pedestal 6b and the intermediate pedestal 22b is provided with a correction spacer (position-adjusting correcting member, correction spacer 24d, hereinafter). The correction spacers 24b to 24d have functions for moderating the machining precision of the lower pedestals 6a and 6b and the intermediate pedestals 22a and 22b. The sizes of the correction spacers 24b to 24d are determined based on size data when the lower pedestals 6a and 6b and the intermediate pedestals 22a and 22b are shaped.

Figure 3:
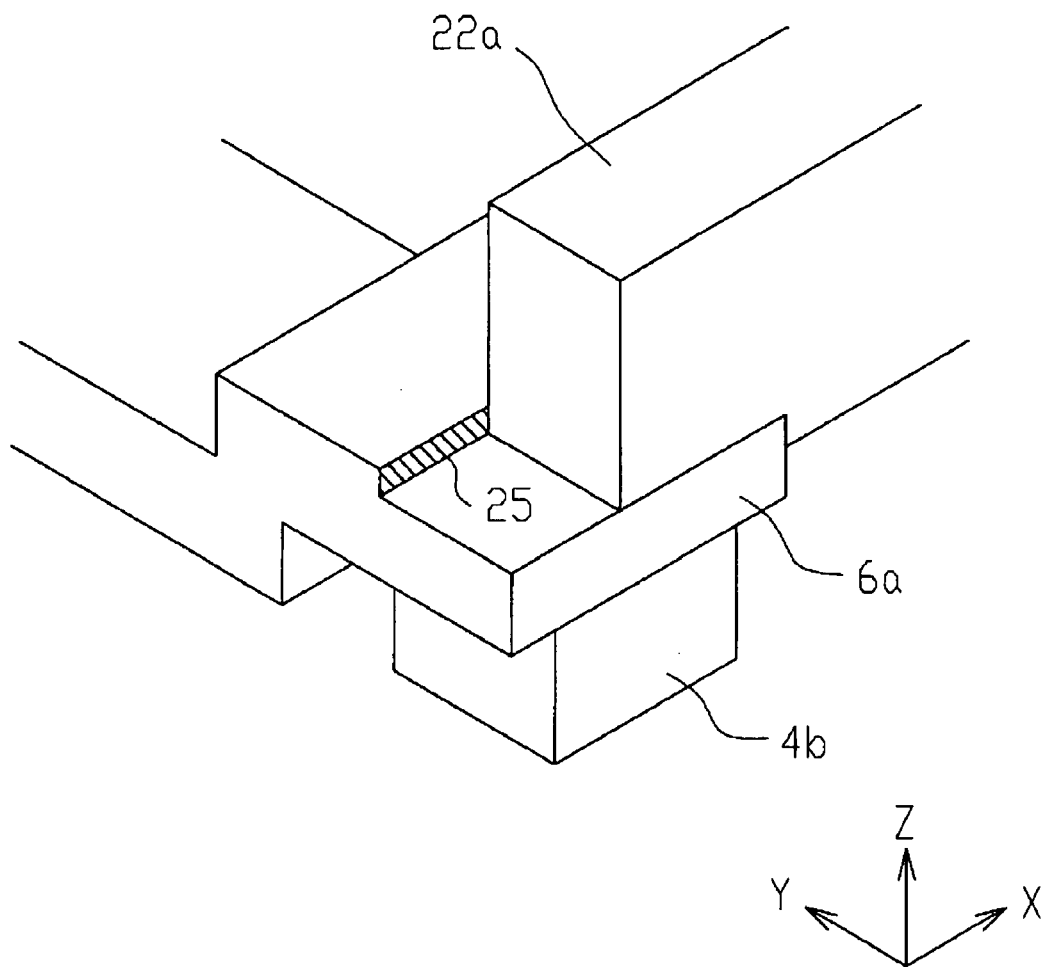
FIG. 3 is a diagram showing a structure of a pushing reference surface.

The connection between the lower pedestal 6a and the intermediate pedestal 22a is provided with a pushing reference surface 25 (hatched portion in FIG. 3). A corresponding surface of the intermediate pedestal 22a is pushed against the pushing reference surface 25 of the lower pedestal 6a using an air caster or the like. The connection between the lower pedestal 6a and the intermediate pedestal 22b and the connection between the lower pedestal 6b and the intermediate pedestals 22a and 22b are also provided with the same pushing reference surfaces as the pushing reference surface 25, and corresponding surfaces of the intermediate pedestals 22a and 22b are pushed against the pushing reference surfaces of the lower pedestals 6a and 6b using air casters or the like.

The upper pedestal 26 is placed on the intermediate pedestals 22a and 22b. The upper pedestal 26 has a longitudinal direction in a direction intersecting with the scanning direction of the plate stage PST (predetermined direction). The upper pedestal 26 is connected such as to intersect with longitudinal directions of the intermediate pedestals 22a and 22b. The mask stage MST and the projection optical system PL are placed on the upper pedestal 26. A width of a space surrounded by the upper pedestal 26 and the lower pedestals 6a and 6b exceeds 500 mm.

The distance between the intermediate pedestals 22a and 22b exceeds 500 mm. With this structure, the width of the space surrounded by the upper pedestal 26, the lower pedestals 6a and 6b and the intermediate pedestals 22a and 22b exceeds 500 mm, and a plate stage PST on which a substrate exceeding 500 mm can be placed can be assembled. The distance between the intermediate pedestals 22a and 22b is set such that a space corresponding to the plate P, or a space corresponding to a moving amount of the plate stage PST is formed.

The connection between the upper pedestal 26 and the intermediate pedestal 22a is provided with correcting shims (position-adjusting correcting members) 28a and 28c. The correcting shims 28a and 28c adjust torsions of later-described air guides 32a and 32b generated after the exposure apparatus is assembled. That is, a jack can be inserted between the upper pedestal 26 and the intermediate pedestal 22a. Therefore, the correcting shims 28a and 28c can easily and finely adjust torsions of the air guides 32a and 32b caused by assembling error of the upper pedestal 26 and the intermediate pedestal 22a. Similarly, the connection between the upper pedestal 26 and the intermediate pedestal 22b is provided with a correcting shim (position-adjusting correcting member) 28d and a correcting shim (position-adjusting correcting member, correcting shim 28d, hereinafter) (not shown). The correcting shims 28d and 28d adjust torsions of the later-described air guides 32a and 32b generated after the exposure apparatus is assembled. That is, a jack can be inserted between the upper pedestal 26 and the intermediate pedestal 22b. Therefore, the correcting shims 28d and 28d can easily and finely adjust torsions of the air guides 32a and 32b caused by assembling error of the upper pedestal 26 and the intermediate pedestal 22b.

The connection between the upper pedestal 26 and the intermediate pedestals 22a and 22b is provided with pushing reference surfaces which are the same as the pushing reference surface 25 (hatched portion in FIG. 3). The upper pedestal 26 and the intermediate pedestals 22a and 22b are pushed against the pushing reference surfaces using air casters or the like.

A mask linear motor stator 30a having a longitudinal direction in the X direction is disposed on the upper pedestal 26 on the side of the −Y direction. A mask linear motor stator 30b having a longitudinal direction in the X direction is disposed on the upper pedestal 26 on the side of the +Y direction. A mask sub-stage (not shown) is disposed between linear motor stators 30a and 30b on the upper pedestal 26 through the air guides 32a and 32b which are guides in the scanning direction (X-axis direction) of the mask stage MST. A non-scanning direction linear motor 34 which is an actuator in a direction intersecting with the scanning direction of the mask stage MST is connected to the mask sub-stage. A mask sub-stage linear motor 36 which is an actuator in the scanning direction of the mask stage MST is connected to the non-scanning direction linear motor 34 on the side of the mask linear motor stator 30a. Therefore, if the mask sub-stage linear motor 36 (and later-described mask linear motors 38a and 38b) is driven, the mask sub-stage and the non-scanning direction linear motor 34 moves along the scanning direction (X-axis direction) of the mask stage MST together with the mask stage MST.

The mask stage MST is disposed on the mask sub-stage (not shown). The mask linear motors 38a and 38b which are actuators in the scanning direction of the mask stage MST are connected to the mask stage MST on the side of the mask linear motor stator 30a. A mask linear motor (not shown) which is an actuator in the scanning direction of the mask stage MST is connected to the mask stage MST on the side of the mask linear motor stator 30b. Therefore, if the mask linear motors 30a and 30b, the mask linear motor (not shown) and the mask sub-stage linear motor 36 are driven, the mask sub-stage, the non-scanning direction linear motor 34 and the mask stage MST moves along the scanning direction of the mask stage MST (X-axis direction).

The mask M (not shown in FIG. 2) is adsorbed and held on the mask stage MST. A side surface of the mask stage MST on the side of the −X direction is provided with two moving mirrors (not shown). Mask stage laser interferometers 40a and 40b radiate laser beam onto the two moving mirrors, and the incident laser beam is reflected by the two moving mirrors. The mask stage laser interferometers 40a and 40b measure and control the position of the mask stage MST in the X-axis direction based on the interference of the laser beam reflected by the two moving mirrors.

A mask laser interferometer 40c is provided on the mask stage MST on the side of the linear motor stator 30b. The mask laser interferometer 40c radiates laser beam onto the fixed mirror 42. The fixed mirror 42 is disposed along the longitudinal direction (X-axis direction) of the mask linear motor stator 30b at a location opposed to the mask stage MST with the mask linear motor stator 30b interposed therebetween. The mask laser interferometer 40c measures and controls a position of the mask stage MST in the Y-axis direction based on the interference of the laser beam reflected by the fixed mirror 42.

Figure 4:
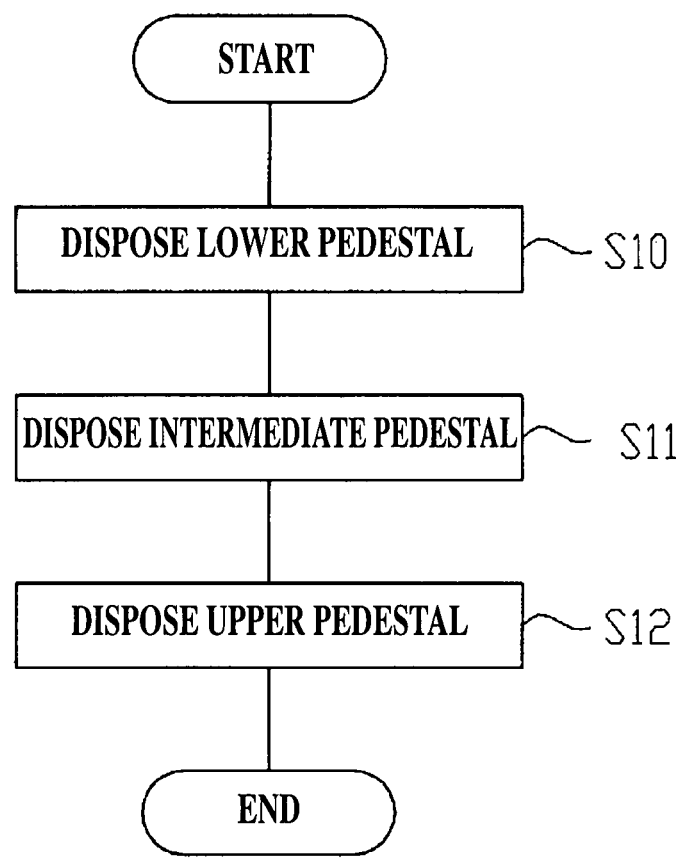
FIG. 4 is a flowchart used for explaining a producing method of the exposure apparatus of the embodiment of the invention.

Next, the producing method of the exposure apparatus according to this embodiment will be explained. FIG. 4 is a flowchart used for explaining the producing method of the exposure apparatus of the embodiment.

First, the lower pedestals 6a and 6b on which the plate stage PST holding the plate P are disposed (step S10, lower pedestal disposing step). More specifically, the lower pedestals 6a and 6b are disposed such as to have longitudinal directions thereof in a direction intersecting with the scanning direction of the plate stage PST (Y-axis direction).

Next, the intermediate pedestals 22a and 22b are disposed on the lower pedestals 6a and 6b disposed in step S10 (step S11, intermediate pedestal disposing step). More specifically, the intermediate pedestals 22a and 22b are disposed such as to have longitudinal direction in the scanning direction (X-axis direction) of the plate stage PST, and the intermediate pedestals 22a and 22b and the lower pedestals 6a and 6b are connected to each other such that the longitudinal directions of the intermediate pedestals 22a and 22b and the longitudinal directions of the lower pedestals 6a and 6b intersect with each other. When connecting, they are fastened to each other through connecting members. Bolts may be used as the connecting members, or they may be adhered or welded to each other.

The upper pedestal 26 on which the mask stage MST holding the mask M and the projection optical system PL are disposed is disposed on the intermediate pedestals 22a and 22b disposed in step S11 (step S12, upper pedestal disposing step). More specifically, the upper pedestal 26 is disposed such as to have longitudinal direction in a direction (Y-axis direction) intersecting with the scanning direction of the plate stage PST, and the upper pedestal 26 and the intermediate pedestals 22a and 22b are connected to each other such that the longitudinal direction of the upper pedestal 26 and the longitudinal directions of the intermediate pedestals 22a and 22b intersect with each other.

The exposure apparatus of the embodiment includes two lower pedestals having longitudinal directions in a direction intersecting with the scanning direction of the plate stage, and includes two intermediate pedestals having longitudinal directions in a direction intersecting with the longitudinal direction of the lower pedestals. The exposure apparatus also includes an upper pedestal having longitudinal direction in a direction intersecting with the longitudinal direction of the intermediate pedestal. Therefore, the pedestal has such a size that the pedestal can be transported, and it is possible to provide an exposure apparatus having a large substrate stage on which a large photosensitive substrate exceeding 500 mm can be placed.

The connection between the lower pedestal and the intermediate pedestal is provided with a connection spacer as a position-adjusting correcting member, the connection between the intermediate pedestal and the upper pedestal is provided with a correcting shim as a position-adjusting correcting member, and the connection between the pedestals is provided with the pushing reference surface. If the pedestal is divided into a plurality of parts, the assembling precision is deteriorated. However, according to the present invention, it is possible to prevent the assembling precision from being deteriorated, and to secure the high exposure precision. Thus, excellent exposing operation can be carried out by the exposure apparatus having high exposure precision.

According to the producing method of the exposure apparatus of the embodiment, it is possible to produce an exposure apparatus in which the lower pedestal supporting the plate stage can be disposed, the intermediate pedestal can be disposed on the lower pedestal, and the upper pedestal supporting the mask M and the projection optical system can be disposed on the intermediate pedestal precisely, the exposure apparatus has a plurality of pedestals each having such a size that the pedestal can be transported, and the exposure can be carried out onto a large photosensitive substrate.

Although the exposure apparatus of the embodiment includes two lower pedestals, the exposure apparatus may have three or more lower pedestals. In this case, at least two of the three or more lower pedestals are connected to the intermediate pedestal. The exposure apparatus may have only one lower pedestal. In this case, since the weight is increased as compared with an exposure apparatus having a plurality of lower pedestals, a honeycomb structure may be employed to reduce the weight of the lower pedestal. Although the exposure apparatus of the embodiment has two intermediate pedestals, the exposure apparatus may have three or more intermediate pedestals. In this case, at least two of the three or more intermediate pedestals are connected to the upper pedestal. A honeycomb structure may be employed to reduce the weight of the plurality of intermediate pedestals.

In the exposure apparatus of the embodiment, both the mask stage and projection optical system are disposed on the upper pedestal, but only one of the mask stage and projection optical system may be disposed on the upper pedestal, or a portion of the exposure body that is different from the mask stage and the projection optical system (e.g., at least a portion of the illumination optical system) may be disposed on the upper pedestal. Further, a honeycomb structure may be employed to reduce the weight of the upper pedestal. Further, like the lower pedestal, a plurality of upper pedestals each having a longitudinal direction in a direction intersecting with the longitudinal direction of each of the intermediate pedestals may be provided. In this case, each of the plurality of upper pedestals may be provided with a surface plate on which the mask stage is disposed.

Although the exposure apparatus of the embodiment includes vibration isolation systems as four support members, the exposure apparatus may includes three or five or more vibration isolation systems.

Figure 5:
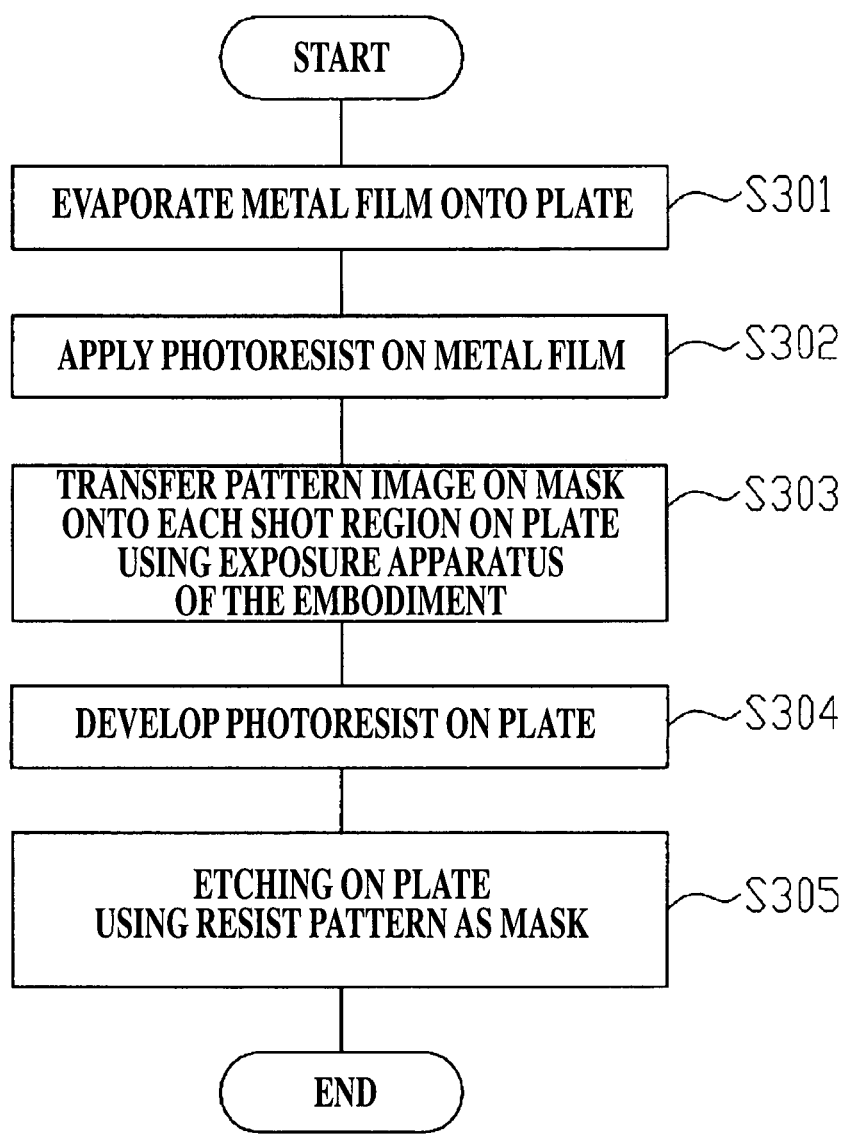
FIG. 5 is a flowchart showing a producing method of a semiconductor device as the microdevice of the embodiment.

According to the exposure apparatus of the embodiment, the illumination optical system illuminates a mask (reticle), a transfer pattern formed on the mask is exposed on to the photosensitive substrate (exposing step), thereby producing a microdevice (semiconductor device, image pickup device, liquid crystal display element, thin film magnetic head and the like). One example when a semiconductor device as a microdevice is obtained by forming a predetermined circuit pattern on a plate as a photosensitive substrate using the exposure apparatus of the embodiment will be explained with reference to the flowchart shown in FIG. 5.

First in step S301 in FIG. 1, a metal film is evaporated on a plate of one lot. In next step S302, a photoresist is applied onto the metal film on the plate of one lot. Then, in step S303, an image of the pattern on the mask is successively exposed and transferred onto each shot region on the plate of one lot. Then, in step S304, the photoresist on the plate of one lot is developed and then, a resist pattern is etched as a mask on the plate of one lot in step S305. With this, a circuit pattern corresponding to the pattern on the mask is formed on each shot region on each plate. Thereafter, the circuit pattern of an upper layer is formed and a device such as a semiconductor device is produced. According to the producing method of a semiconductor device, a fine pattern on a mask can precisely be exposed onto a substrate, and an excellent semiconductor device can be obtained.

Figure 6:
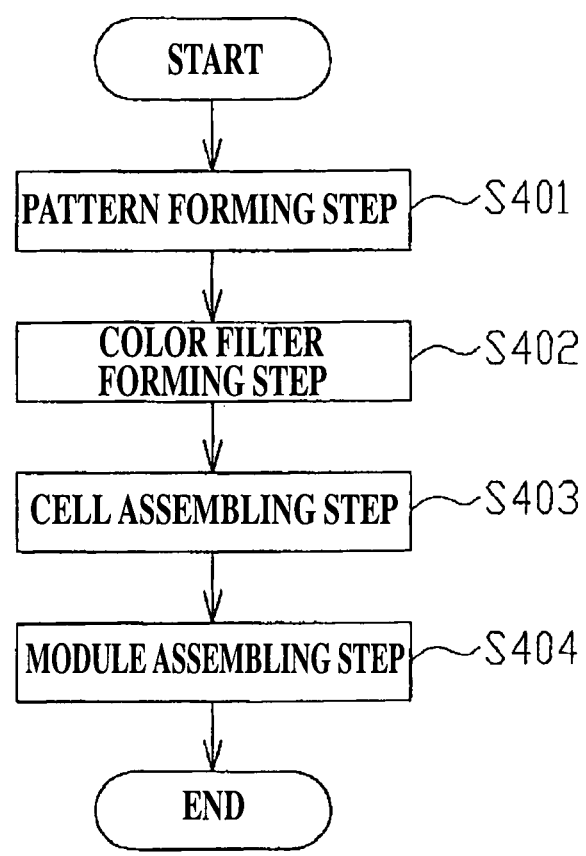
FIG. 6 is a flowchart showing a producing method of a liquid crystal display element as the microdevice of the embodiment.
Figure 7:
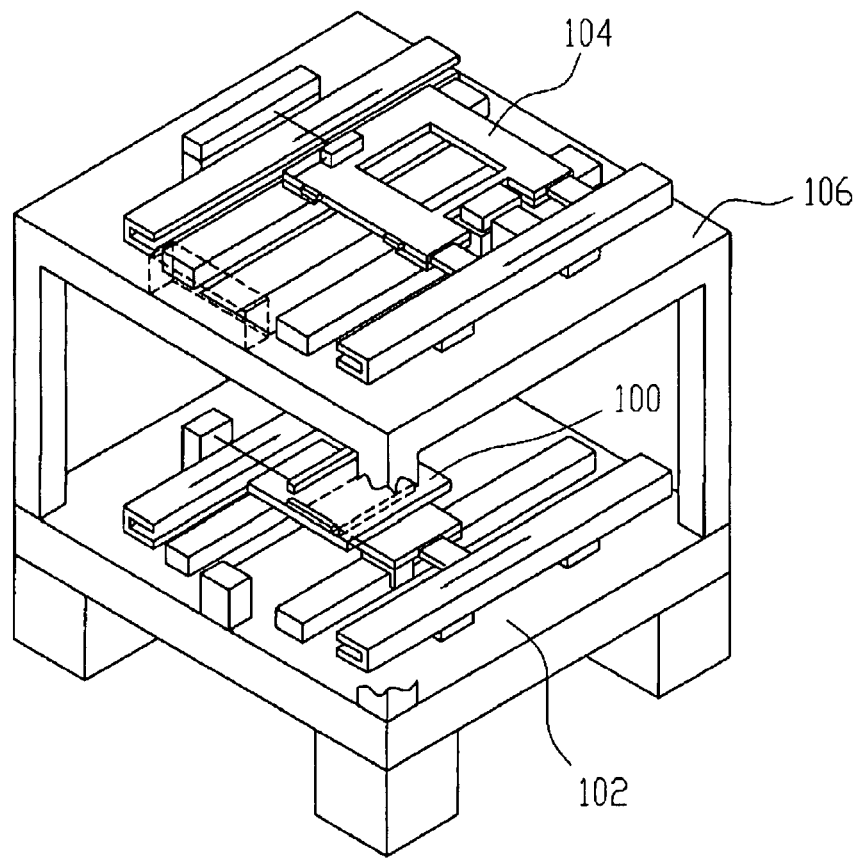
FIG. 7 is a schematic perspective view showing a structure of a conventional exposure apparatus from its mask stage to its plate stage.

According to the exposure apparatus of the embodiment, a liquid crystal display element as a microdevice can be obtained by forming a predetermined pattern (circuit pattern, electrode pattern and the like) on a plate (glass substrate). One example of such a technique will be explained with reference to FIG. 6. In FIG. 6, in a pattern forming step S401, a so-called optical lithography step is carried out. In the optical lithography step, a pattern of a mask is transferred and exposed onto a photosensitive substrate (glass substrate to which resist is applied) using the exposure apparatus of the embodiment. By the optical lithography step, a predetermined pattern including a large number of electrodes is formed on the photosensitive substrate. Then, the exposed substrate is subjected to a developing step, an etching step, a resist-peeling off step and the like, a predetermined pattern is formed on a substrate, and the procedure is advanced to a next color filter forming step S402.

Next, in the color filter forming step S402, a large number of sets of three dots corresponding to R (Red), G (Green) and B (Blue) are arranged in a matrix form, or a color filter is formed. In the color filter, sets of three filters of strips of R, G and B are arranged in a plurality of horizontal scanning directions. A cell assembling step S403 is carried out after the color filter forming step S402. In the cell assembling step S403, a liquid crystal panel (liquid crystal cell) is assembled using a substrate having a predetermined pattern obtained in the pattern forming step S401 and a color filter obtained by the color filter forming step S402.

In the cell assembling step S403, liquid crystal is infused between a substrate having a predetermined pattern obtained in the pattern forming step S401 and a color filter obtained in the color filter forming step S402, and a liquid crystal panel (liquid crystal cell) is produced. Then, various parts such as an electric circuit which allows the assembled liquid crystal panel (liquid crystal cell) to display, and a backlight, thereby completing a liquid crystal display element. According to the producing method of the liquid crystal display element, a fine pattern can precisely be exposed onto a large substrate, and an excellent liquid crystal display element can be obtained.

INDUSTRIAL APPLICABILITY

As described above, the exposure apparatus, the producing method of the exposure apparatus, and the producing method of the microdevice are suitable for producing a large microdevice such as a flat panel display element like a liquid crystal display element using a lithography step.

The invention claimed is:

1. An exposure apparatus having an illumination optical system that irradiates light from a light source onto a mask, a mask stage that holds the mask, a projection optical system that projects a pattern of the mask onto a substrate, and a substrate stage that holds the substrate, to project the pattern of the mask onto the substrate while relatively moving the mask stage and the substrate stage along a first direction that is perpendicular to a projection direction in which the pattern of the mask is projected onto the substrate, the exposure apparatus further comprising:

an upper pedestal that supports the mask stage; and
first and second intermediate pedestals that support the upper pedestal, wherein:
the projection optical system (i) includes a plurality of projection optical modules that are arranged at different positions in a second direction perpendicular to the first direction and perpendicular to the projection direction, (ii) transmits light, which has passed through different portions of the mask, to respective ones of the plurality of projection optical modules, and (iii) projects the pattern of the mask onto the substrate,
the first intermediate pedestal is arranged at a first side, in the second direction, of the plurality of projection optical modules, and
the second intermediate pedestal is arranged at a second side opposite to the first side, in the second direction, of the plurality of projection optical modules.

2. The exposure apparatus according to claim 1, wherein:
the upper pedestal includes a rectangular member that has a length elongated in the second direction.

3. The exposure apparatus according to claim 2, wherein:
the first intermediate pedestal includes a first rectangular member that has a length elongated in the first direction, and
the second intermediate pedestal includes a second rectangular member that has a length elongated in the first direction.

4. The exposure apparatus according to claim 3, further comprising:
first and second lower pedestals that support the first and second intermediate pedestals and support the substrate stage, wherein:
the first lower pedestal includes a first lower rectangular member that has a length elongated in the second direction, and
the second lower pedestal includes a second lower rectangular member that has a length elongated in the second direction.

5. The exposure apparatus according to claim 4, wherein:
the first and second lower pedestals are arranged at different positions in the first direction, and
lengths of the first and second intermediate pedestals in the first direction are shorter than a movable range of the substrate stage in the first direction.

6. The exposure apparatus according to claim 5, further comprising:
a guide member of the substrate stage, the guide member having a length including the movable range, wherein:
the lengths of the first and second intermediate pedestals in the first direction are shorter than a length of the guide member in the first direction.

7. The exposure apparatus according to claim 4, wherein:
the first and second intermediate pedestals are connected to the first and second lower pedestals.

8. The exposure apparatus according to claim 4, further comprising:
position-adjusting correcting members at connections between the upper pedestal and the first and second intermediate pedestals, or at connections between the first and second intermediate pedestals and the first and second lower pedestals.

9. The exposure apparatus according to claim 4, wherein:
connections between the upper pedestal and the first and second intermediate pedestals, or connections between the first and second intermediate pedestals and the first and second lower pedestals each have pressing reference surfaces.

10. The exposure apparatus according to claim 4, wherein:
the first and second lower pedestals are supported by at least four support members.

11. The exposure apparatus according to claim 4, further comprising:
at least one shim disposed between the first and second intermediate pedestals and the first and second lower pedestals.

12. The exposure apparatus according to claim 1, wherein:
the first intermediate pedestal includes a first rectangular member that has a length elongated in the first direction, and
the second intermediate pedestal includes a second rectangular member that has a length elongated in the first direction.

13. The exposure apparatus according to claim 12, further comprising:
an interferometer that is arranged on at least one of the first and second intermediate pedestals and irradiates measurement light in the second direction.

14. The exposure apparatus according to claim 1, further comprising:
a fixing plate that supports the substrate stage, wherein:
lengths of the first and second intermediate pedestals in the first direction are shorter than a length of the fixing plate in the first direction.

15. The exposure apparatus according to claim 14, wherein:
the fixing plate is a rectangular member that has a length elongated in the first direction, and
the lengths of the first and second intermediate pedestals in the first direction are shorter than a length of the fixing plate in the first direction.

16. The exposure apparatus according to claim 1, wherein:
the upper pedestal is connected to the first and second intermediate pedestals.

17. The exposure apparatus according to claim 1, wherein:
the upper pedestal supports the projection optical system.

18. The exposure apparatus according to claim 1, wherein:
the first and second intermediate pedestals define a space at which the projection optical system is disposed.

19. The exposure apparatus according to claim 1, wherein:
an outer diameter of the substrate exceeds 500 mm.

20. A method of manufacturing a microdevice, the method comprising:
exposing a pattern of a mask onto a substrate, using the exposure apparatus according to claim 1, and
developing the exposed substrate.

21. The method according to claim 20, wherein:
a plurality of flat panel display devices are formed on the substrate.

22. The exposure apparatus according to claim 1, wherein:
the mask stage supports an electronic mask that can change the pattern of the mask.

23. The exposure apparatus according to claim 1, further comprising:
at least one shim disposed between the upper pedestal and the first and second intermediate pedestals.

24. An exposure apparatus having an illumination optical system that irradiates light from a light source onto a mask, a mask stage that holds the mask, and a substrate stage that holds a substrate, to project a pattern of the mask onto the substrate while relatively moving the mask stage and the substrate stage along a first direction that is a scanning direction in a state in which the light is irradiated onto the mask, the exposure apparatus further comprising:

a projection optical system that (i) includes a plurality of projection optical modules that are arranged at different positions in a second direction perpendicular to the first direction and perpendicular to a projection direction in which the pattern of the mask is projected onto the substrate, (ii) transmits light, which has passed through the mask, to respective ones of the plurality of projection optical modules, and (iii) projects the pattern of the mask onto the substrate;

an upper pedestal that supports the mask stage;

first and second intermediate pedestals that support the upper pedestal; and first and second lower pedestals that support the first and second intermediate pedestals, and on which the substrate stage that holds the substrate is mounted, wherein:

the first and second lower pedestals are arranged on opposite sides of the plurality of projection optical modules relative to the first direction, the first and second lower pedestals are separate from each other, a first side of the first intermediate pedestal is attached to a first side of the first lower pedestal, a second side of the first intermediate pedestal is attached to a first side of the second lower pedestal, a first side of the second intermediate pedestal is attached to a second side of the first lower pedestal, and a second side of the second intermediate pedestal is attached to a second side of the second lower pedestal.

25. The exposure apparatus according to claim 24, wherein:

the first lower pedestal includes a first rectangular member that has a length elongated in the second direction, and the second lower pedestal includes a second rectangular member that has a length elongated in the second direction.

26. The exposure apparatus according to claim 24, further comprising:

a fixing plate that supports the substrate stage, wherein:

the fixing plate includes a rectangular member that has a length elongated in the first direction, and the first and second lower pedestals are arranged at different positions in the first direction.

27. The exposure apparatus according to claim 26, wherein:

the fixing plate is supported at one side, in the first direction, by the first lower pedestal and is supported at another side, opposite to the one side, by the second lower pedestal.

28. The exposure apparatus according to claim 24, further comprising:

a guide member of the substrate stage, the guide member having a length in the first direction that includes a movable range of the substrate stage, wherein:

the guide member is supported at one side, in the first direction, by the first lower pedestal and is supported at another side, opposite to the one side, in the first direction, by the second lower pedestal.

29. The exposure apparatus according to claim 24, wherein:

the first intermediate pedestal includes a first member that has a length elongated in the first direction;

the second intermediate pedestal includes a second member that has a length elongated in the first direction;

the first lower pedestal includes a first lower member that has a length elongated in the second direction;

the second lower pedestal includes a second lower member that has a length elongated in the second direction; and lengths of the first and second intermediate pedestals in the first direction are shorter than lengths of the first and second lower pedestals in the second direction.

30. The exposure apparatus according to claim 24, wherein:

a width of a space surrounded by the upper pedestal and the first and second lower pedestals exceeds 500 mm.

31. An exposure apparatus having an illumination optical system that irradiates light from a light source onto a mask, a mask stage that holds the mask, a projection optical system that projects a pattern of the mask onto a substrate, and a substrate stage that holds the substrate, to project the pattern of the mask onto the substrate while relatively moving the mask stage and the substrate stage along a first direction that is perpendicular to an optical axis of the projection optical system, the exposure apparatus further comprising:

an upper pedestal that supports the mask stage; and first and second intermediate pedestals that support the upper pedestal, wherein:

the projection optical system (i) includes a plurality of projection optical modules that are arranged at different positions in a second direction perpendicular to the first direction and perpendicular to the optical axis, (ii) transmits light, which has passed through different portions of the mask, to respective ones of the plurality of projection optical modules, and (iii) projects the pattern of the mask onto the substrate, the first intermediate pedestal is arranged at a first side, in the second direction, of the plurality of projection optical modules, and the second intermediate pedestal is arranged at a second side opposite to the first side, in the second direction, of the plurality of projection optical modules.

32. An exposure apparatus having an illumination optical system that irradiates light from a light source onto a mask, a mask stage that holds the mask, a projection optical system that projects a pattern of the mask onto a substrate, and a substrate stage that holds the substrate, wherein the illumination optical system, the mask stage, the projection optical system and the substrate stage are disposed in this order along a disposing direction, and to project the pattern of the mask onto the substrate while relatively moving the mask stage and the substrate stage along a first direction that is perpendicular to the disposing direction, the exposure apparatus further comprising:

an upper pedestal that supports the mask stage; and first and second intermediate pedestals that support the upper pedestal, wherein:

the projection optical system (i) includes a plurality of projection optical modules that are arranged at different positions in a second direction perpendicular to the first direction and perpendicular to the disposing direction, (ii) transmits light, which has passed through different portions of the mask, to respective ones of the plurality of projection optical modules, and (iii) projects the pattern of the mask onto the substrate, the first intermediate pedestal is arranged at a first side, in the second direction, of the plurality of projection optical modules, and the second intermediate pedestal is arranged at a second side opposite to the first side, in the second direction, of the plurality of projection optical modules.

33. An exposure apparatus having an illumination optical system that irradiates light from a light source onto a mask, a mask stage that holds the mask, and a substrate stage that holds a substrate, to project a pattern of the mask onto the substrate while relatively moving the mask stage and the substrate stage along a first direction that is a scanning direction in a state in which the light is irradiated onto the mask, the exposure apparatus further comprising:
- a projection optical system that has an optical axis and (i) includes a plurality of projection optical modules that are arranged at different positions in a second direction perpendicular to the first direction and perpendicular to the optical axis, (ii) transmits light, which has passed through the mask, to respective ones of the plurality of projection optical modules, and (iii) projects the pattern of the mask onto the substrate;
- an upper pedestal that supports the mask stage;
- first and second intermediate pedestals that support the upper pedestal; and
- first and second lower pedestals that support the first and second intermediate pedestals, and on which the substrate stage that holds the substrate is mounted, wherein:
- the first and second lower pedestals are arranged on opposite sides of the plurality of projection optical modules relative to the first direction,
- the first and second lower pedestals are separate from each other,
- a first side of the first intermediate pedestal is attached to a first side of the first lower pedestal,
- a second side of the first intermediate pedestal is attached to a first side of the second lower pedestal,
- a first side of the second intermediate pedestal is attached to a second side of the first lower pedestal, and
- a second side of the second intermediate pedestal is attached to a second side of the second lower pedestal.

34. An exposure apparatus having an illumination optical system that irradiates light from a light source onto a mask, a mask stage that holds the mask, a projection optical system that projects a pattern of the mask onto a substrate, and a substrate stage that holds the substrate, wherein the illumination optical system, the mask stage, the projection optical system and the substrate stage are disposed in this order along a disposing direction, and to project a pattern of the mask onto the substrate while relatively moving the mask stage and the substrate stage along a first direction that is a scanning direction in a state in which the light is irradiated onto the mask, the exposure apparatus further comprising:
- an upper pedestal that supports the mask stage;
- first and second intermediate pedestals that support the upper pedestal; and
- first and second lower pedestals that support the first and second intermediate pedestals, and on which the substrate stage that holds the substrate is mounted, wherein:
- the projection optical system (i) includes a plurality of projection optical modules that are arranged at different positions in a second direction perpendicular to the first direction and perpendicular to the disposing direction, (ii) transmits light, which has passed through the mask, to respective ones of the plurality of projection optical modules, and (iii) projects the pattern of the mask onto the substrate;
- the first and second lower pedestals are arranged on opposite sides of the plurality of projection optical modules relative to the first direction,
- the first and second lower pedestals are separate from each other,
- a first side of the first intermediate pedestal is attached to a first side of the first lower pedestal,
- a second side of the first intermediate pedestal is attached to a first side of the second lower pedestal,
- a first side of the second intermediate pedestal is attached to a second side of the first lower pedestal, and
- a second side of the second intermediate pedestal is attached to a second side of the second lower pedestal.

35. A device manufacturing method that manufactures a device by exposing a substrate while relatively moving a mask and the substrate in a first direction, the method comprising:
- irradiating light from a light source via an illumination optical system onto the mask held by a mask stage that is mounted on an upper pedestal supported by (i) a first intermediate pedestal that is arranged at a first side, in a second direction that is perpendicular to the first direction, with respect to a plurality of projection optical modules arranged at different positions in the second direction, and (ii) a second intermediate pedestal that is arranged at a second side opposite to the first side, in the second direction, with respect to the plurality of projection optical modules, the first and second directions being perpendicular to a projection direction in which a pattern of the mask is projected onto the substrate; and
- transmitting light that has passed through different portions of the mask, to respective ones of the plurality of projection optical modules while relatively moving the mask stage and a substrate stage that holds the substrate along the first direction to project the pattern of the mask onto the substrate.

36. The device manufacturing method according to claim 35, further comprising:
- developing the substrate on which the pattern of the mask has been projected; and
- etching the developed substrate to form a circuit pattern on the substrate.

37. The device manufacturing method according to claim 36, further comprising:
- forming a color filter on the substrate on which the circuit pattern has been formed; and
- manufacturing a liquid crystal panel by injecting liquid crystal between the color filter and the circuit pattern.

38. The device manufacturing method according to claim 37, further comprising:
- assembling a module by attaching to the liquid crystal panel (i) an electronic circuit that performs a display operation of the liquid crystal panel, and (ii) a backlight that illuminates the color filter.

* * * * *